(12) United States Patent
Lee et al.

(10) Patent No.: US 9,202,805 B2
(45) Date of Patent: Dec. 1, 2015

(54) LED PACKAGE STRUCTURE INCLUDING DARK-COLORED AND LIGHT-TRANSMISSIBLE ENCAPSULANT

(71) Applicants: LITE-ON OPTO TECHNOLOGY (CHANGZHOU) CO., LTD., Jiangsu Province (CN); LITE-ON TECHNOLOGY CORP., Taipei (TW)

(72) Inventors: Hou-Te Lee, Taipei (TW); Tsung-Kang Ying, Taipei (TW); Erh-Chan Hsu, Taipei (TW)

(73) Assignees: Lite-On Opto Technology (Changzhou) Co., Ltd., Jiangsu Province (CN); Lite-On Technology Corp., Taipei (TW)

( * ) Notice: Subject to any disclaimer, the term of this patent is extended or adjusted under 35 U.S.C. 154(b) by 0 days.

(21) Appl. No.: 14/590,263

(22) Filed: Jan. 6, 2015

(65) Prior Publication Data

US 2015/0294959 A1    Oct. 15, 2015

(30) Foreign Application Priority Data

Apr. 10, 2014  (CN) .......................... 2014 1 0143790

(51) Int. Cl.
  *H01L 33/56*   (2010.01)
  *H01L 25/075*  (2006.01)
  *H01L 33/48*   (2010.01)
  *H01L 33/54*   (2010.01)
  *H01L 33/58*   (2010.01)
  *H01L 33/62*   (2010.01)

(52) U.S. Cl.
  CPC .......... *H01L 25/0753* (2013.01); *H01L 33/486* (2013.01); *H01L 33/54* (2013.01); *H01L 33/58* (2013.01); *H01L 33/62* (2013.01)

(58) Field of Classification Search
  None
  See application file for complete search history.

(56) References Cited

U.S. PATENT DOCUMENTS

| | | | |
|---|---|---|---|
| 7,524,087 B1 * | 4/2009 | Aizar et al. | 362/267 |
| 2013/0207144 A1 * | 8/2013 | Ramchen et al. | 257/98 |
| 2013/0307013 A1 * | 11/2013 | Chan et al. | 257/99 |
| 2014/0353694 A1 * | 12/2014 | Pang et al. | 257/89 |

* cited by examiner

Primary Examiner — Joseph Schoenholtz
(74) Attorney, Agent, or Firm — Rosenberg, Klein & Lee (57) ABSTRACT

An LED package structure includes: an insulating substrate that has a front bonding pad assembly; a dark-colored die-attach adhesive; blue and green LED chips mounted on the front bonding pad assembly via the dark-colored die-attach adhesive; and a dark-colored and light-transmissible encapsulant that is disposed on the insulating substrate and that encapsulates the blue and green LED chips. The encapsulant has a light transmittance that ranges from 7% to 28% for the blue light and has a light transmittance that ranges from 9% to 30% for the green light.

20 Claims, 6 Drawing Sheets

LED PACKAGE STRUCTURE INCLUDING DARK-COLORED AND LIGHT-TRANSMISSIBLE ENCAPSULANT

CROSS-REFERENCE TO RELATED APPLICATION

This application claims priority of Chinese Patent Application No. 201410143790.9, filed on Apr. 10, 2014.

FIELD OF THE INVENTION

This invention relates to an LED package structure, more particularly to a surface mount device (SMD)-type LED package structure.

BACKGROUND OF THE INVENTION

A conventional LED package structure often includes a white insulating substrate, a transparent or white die-attach adhesive, and a transparent encapsulant for improving brightness thereof. However, when the conventional LED package structure is used as a light source in an indoor display device, glare phenomenon may happen under a relatively low ambient lighting condition. This glare phenomenon is attributed to the transparent or white die-attach adhesive. The glare phenomenon not only reduces contrast ratio of the display device but also makes the eyes of a user feel uncomfortable.

Therefore, when an LED package structure is used as a light source in an indoor display device, it is important to consider how to improve contrast ratio of the display device and comfort for the eyes of a user.

SUMMARY OF THE INVENTION

An object of the present invention is to provide an LED package structure that is capable of improving display contrast ratio and viewing comfort.

The LED package structure of an exemplary embodiment of this invention has an almost black appearance due to the application of a black substrate, a dark-colored die-attach adhesive ("dark-colored" as used herein represents a grayscale ranging from 30 to 50), a black solder mask that is applied on the black substrate, and a dark-colored and light-transmissible encapsulant. Thus, a display device utilizing the LED package structure is almost dark when the LED package structure is not lit up. When the LED package structure is lit up, contrast ratio of the display device is improved. The dark-colored and light-transmissible encapsulant has a roughened surface to scatter incident light, thereby improving viewing comfort.

BRIEF DESCRIPTION OF THE DRAWINGS

Other features and advantages of the present invention will become apparent in the following detailed description of the embodiment with reference to the accompanying drawings, of which.

DETAILED DESCRIPTION OF THE EXEMPLARY EMBODIMENT

FIGS. 1 to 5 illustrate an exemplary embodiment of an LED package structure 2 according to the present invention. The LED package structure 2 is a surface mount device (SMD)-type LED package structure that includes: an insulating substrate 20; a red LED chip (R), a green LED chip (G) and a blue LED chip (B) that are disposed on the insulating substrate 20; and a dark-colored and light-transmissible encapsulant 21.

Figure 1:
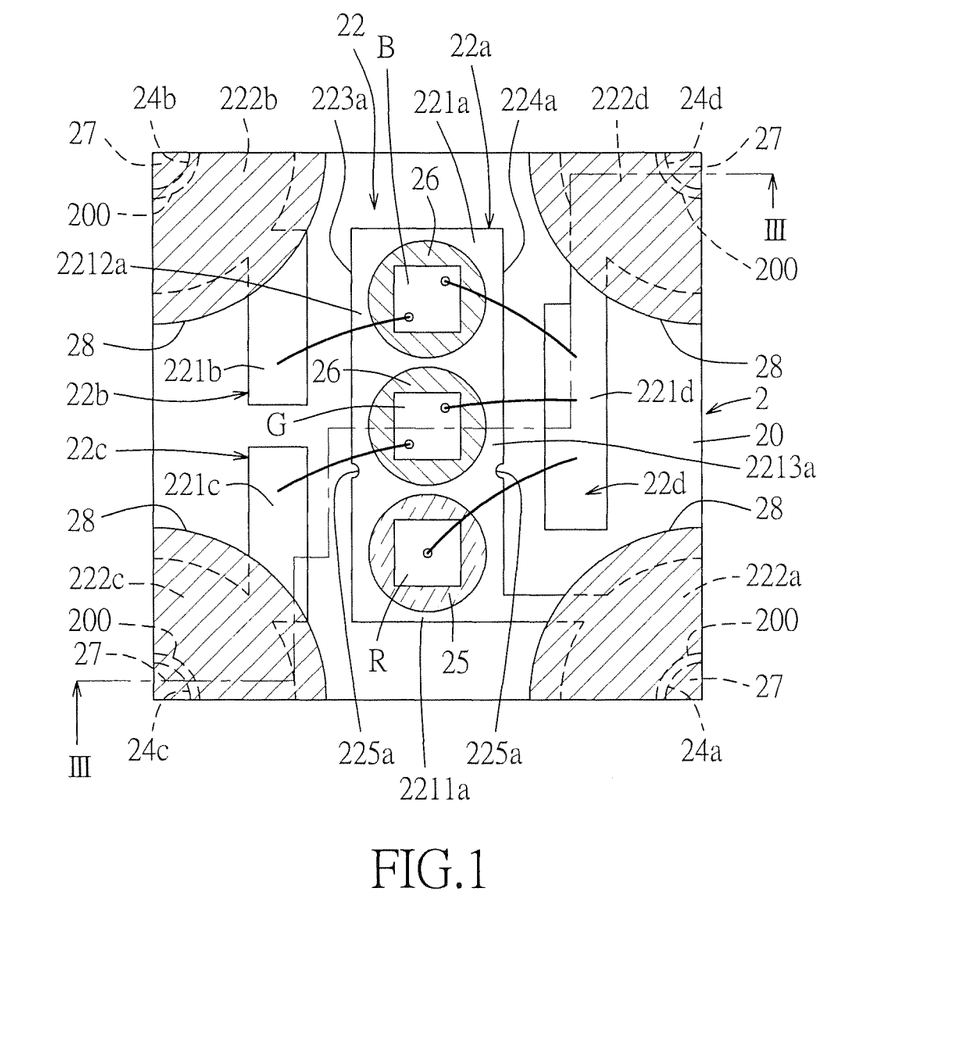
FIG. 1 is a front view of an exemplary embodiment of an LED package structure according to the present invention.
Figure 2:
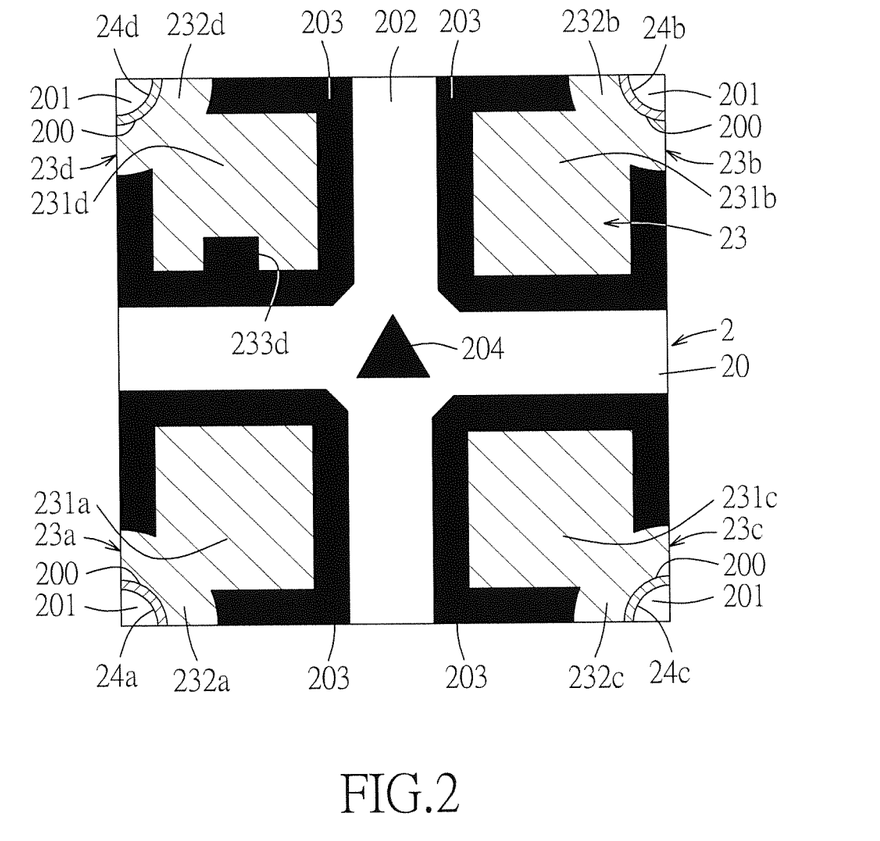
FIG. 2 is a rear view of the exemplary embodiment.
Figure 3:
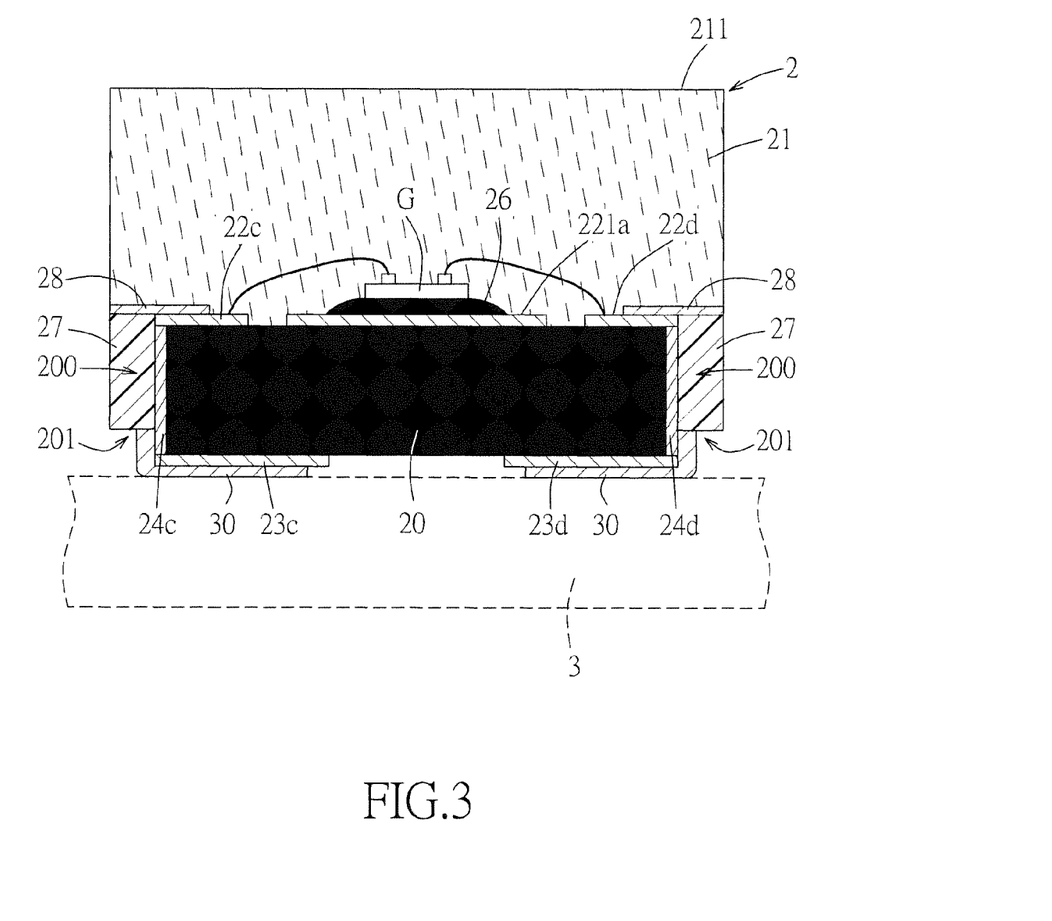
FIG. 3 is a cross-sectional view taken along line III-III of FIG. 1.

In this embodiment, the insulating substrate 20 has a rectangular shape with dimensions of about 0.8 mm in length, 0.8 mm in width, and 0.5 mm in height. The insulating substrate 20 has a front bonding pad assembly 22 disposed on a front surface thereof, a rear soldering pad assembly 23 disposed on a rear surface thereof, and electrical-conducting portions 24a, 24b, 24c, 24d disposed on four corners thereof. The front bonding pad assembly 22 includes a die bonding pad 22a that has a carrying portion 221a and a connecting portion 222a, and a wire bonding pad unit that includes first, second, and third wire bonding pads 22b, 22c, 22d. The carrying portion 221a is disposed on a center portion of the front surface of the insulating substrate 20 and has opposite first and second longitudinal sides 223a, 224a. The carrying portion 221a further has first, second, and third bonding portions 2211a, 2212a, 2213a for respectively mounting the red, blue, and green LED chips (R), (B), (G) thereon. The first and second wire bonding pads 22b, 22c respectively have first and second wire bonding portions 221b, 221c that are disposed along and spaced apart from the first longitudinal side 223a of the carrying portion 221a. The third wire bonding pad 22d has a third wire bonding portion 221d that is disposed adjacent to and spaced apart from the second longitudinal side 224a of the carrying portion 221a. A wire that is electrically connected to the blue LED chip (B) is bonded to the first wire bonding pad 22b. A wire that is electrically connected to the green LED chip (G) is bonded to the second wire bonding pad 22c. A wire that is electrically connected to the red LED chip (R) is bonded to the third wire bonding pad 22d. The first, second, and third wire bonding pads 22b, 22c, 22d further respectively have first, second, and third connecting portions 222b, 222c, 222d. The connecting portion 222a of the die bonding pad 22a is disposed at a corner of the front surface of the insulating substrate 20 and is electrically connected to and surrounds the electrical-conducting portion 24a. The first, second, and third connecting portions 222b, 222c, 222d are respectively disposed on three other corners of the insulating substrate 20 and are electrically connected to and surround the electrical-conducting portions 24b, 24c, 24d, respectively. In this embodiment, the connecting portion 222a of the die bonding pad 22a and the first, second, and third connecting portions 222b, 222c, 222d respectively have an arcuate shape.

Figure 6:
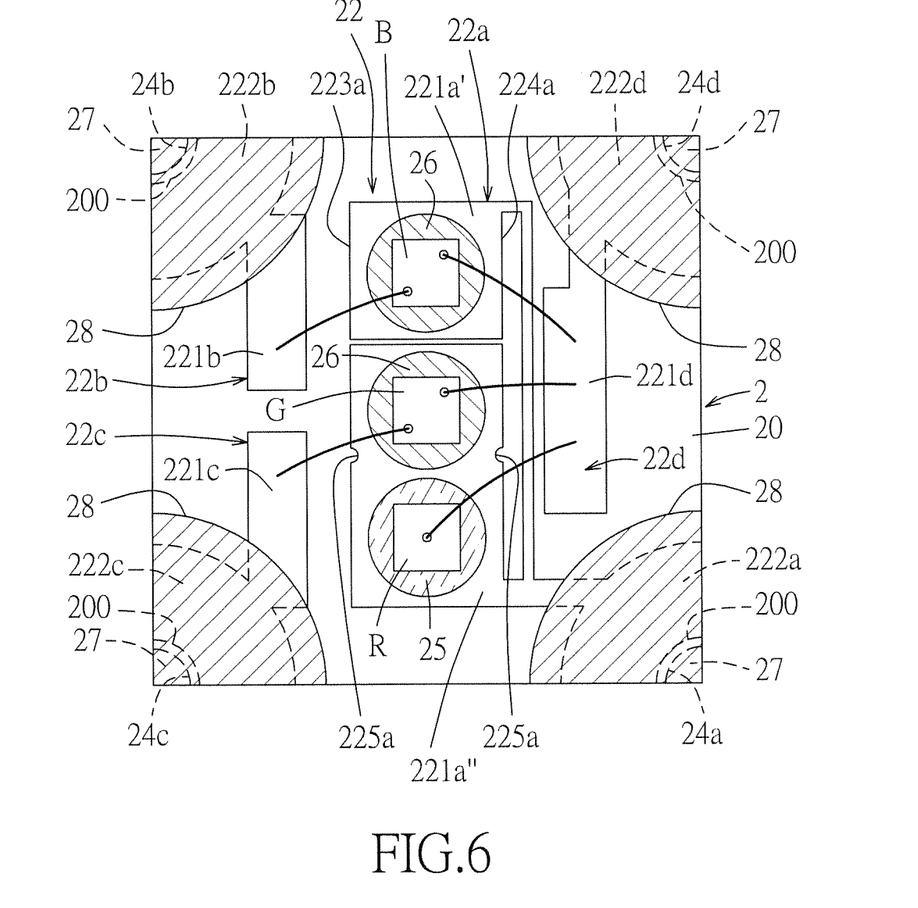
FIG. 6 shows a variation of the exemplary embodiment in which a front bonding pad assembly has first and second die bonding pads.

Alternatively, as shown in FIG. 6, the carrying portion 221a of the die bonding pad 22a may have a first region 221a' and a second region 221a" spaced apart from the first region 221a'. In this example, the blue LED chip (B) is mounted on the first region 221a'. The green and red LED chips (G), (R) are mounted on the second region 221a". In another example, the green LED chip (G) may be mounted on the first region 221a', and the blue and red LED chips (B), (R) may be mounted on the second region 221a". In yet another example, the red LED chip (R) may be mounted on the first region 221a, and the blue and green LED chips (B), (G) may be mounted on the second region 221a". It should be noted that the carrying portion 221a may have three regions on which the blue, green and red LED chips (B), (G), (R) are respectively mounted.

The rear soldering pad assembly 23 includes first, second, third, and fourth soldering pads 23a, 23b, 23c, 23d that are respectively disposed on four corners of the rear surface of the insulating substrate 20. The first, second, third, and fourth soldering pads 23a, 23b, 23c, 23d respectively have soldering portions 231a, 231b, 231c, 231d, and connecting portions 232a, 232b, 232c, 232d. The fourth soldering pad 23d is used as a common anode, and thus a cut 233d is formed in the soldering portion 231d of the fourth soldering pad 23d for notation. The insulating substrate 20 is processed to form four via holes 200 at four corners thereof. Each of the via holes 200 is defined between the front and rear surfaces of the insulating substrate 20. Each of the electrical-conducting portions 24a, 24b, 24c, 24d is a metal conductive layer that is formed in a respective one of the via holes 200 by, e.g., electroplating. The connecting portion 222a of the die bonding pad 22a surrounds the electrical-conducting portion 24a and one of the via holes 200. The first, second, and third connecting portions 222b, 222c, 222d respectively surround the electrical-conducting portions 24b, 24c, 24d and the rest of via holes 200. Upper ends of the electrical-conducting portions 24a, 24b, 24c, 24d are electrically connected to the connecting portion 222a of the die bonding pad 22a and the first, second, and third connecting portions 222b, 222c, 222d of the first, second and third wire bonding pads 22b, 22c, 22d, respectively. Lower ends of the electrical-conducting portions 24a, 24b, 24c, 24d are electrically connected to the connecting portions 232a, 232b, 232c, 232d of the first, second, third and fourth soldering pads 23a, 23b, 23c, 23d of the rear soldering pad assembly 23, respectively. In this embodiment, the insulating substrate 20 is a printed circuit board, such as a bismaleimide triazine (BT) epoxy resin based printed circuit board. The front bonding pad assembly 22 and the rear soldering pad assembly 23 are made of copper foil and are printed on the insulating substrate 20. The rear surface of the insulating substrate 20 is coated with a cross-shaped white-colored solder mask 202 such that a backside portion 203 of the insulating substrate 20 is exposed and such that each of the first, second, third and fourth soldering pads 23a, 23b, 23c, 23d is separated from the solder mask 202 by the exposed backside portion 203 of the insulating substrate 20. Formation of the solder mask 202 could prevent short circuit due to excess soldering. A triangular mark 204 is formed on a center portion of the solder mask 202.

The red LED chip (R) emits red light that has a wavelength ranging from 615 to 630 nm. The green LED chip (G) emits green light that has a wavelength ranging from 520 to 540 nm. The blue LED chip (B) emits blue light that has a wavelength ranging from 460 to 480 nm. Each of the red, green, and blue LED chips (R), (G), (B) has two electrodes. In this embodiment, one of the electrodes of the red LED chip (R) (e.g., cathode) is disposed on a top surface thereof, and the other one of the electrodes (e.g., anode) is disposed on a bottom surface thereof. In each of the green and blue LED chips (G), (B), the two electrodes are disposed on a top surface thereof. The red, green, and blue LED chips (R), (G) (B) are aligned in a longitudinal direction, thereby providing a small, full-colored LED package structure. The first and second longitudinal sides 223a, 224a of the carrying portion 221a are respectively formed with opposite notches 225a for locating and distinguishing the red, green and blue LED chips (R) (G), (B).

The red LED chip (R) is a vertical LED chip. Therefore, the electrode (e.g., anode) disposed on the bottom surface of the red LED chip (R) is mounted on the carrying portion 221a and electrically connected to the die bonding pad 22a by a conductive silver adhesive 25. The green and blue LED chips (G), (B) are mounted on the carrying portion 221a by a dark-colored die-attach adhesive 26. The electrode (e.g., cathode) of the blue LED chip (B) is electrically connected to the first wire bonding portion 221b of the first wire bonding pad 22b by a metal wire. The electrode (e.g., cathode) of the green LED chip (G) is electrically connected to the second wire bonding portion 221c of the second wire bonding pad 22c by a metal wire. The anodes of the blue, green, and red LED chips (B), (G), (R) are electrically connected to the third wire bonding portion 221d of the third wire bonding pad 22d by metal wires. As a result, the red, green, and blue LED chips (R), (G), (B) are respectively and electrically connected through the electrical-conducting portions 24a, 24b, 24c, 24d to the first, second, third, and fourth soldering pads 23a, 23b, 23c, 23d.

It is worth mentioning that, in another embodiment, the electrodes (cathode and anode) of the red LED chip (R) may both be disposed on the top surface thereof. In such case, the red LED chip (R) is mounted on the carrying portion 221a of the die bonding pad 22a through the dark-colored die-attach adhesive 26. The cathode of the red LED chip (R) is connected to the carrying portion 221a of the die bonding pad 22a by a metal wire.

In this embodiment, the encapsulant 21 fully covers the front surface of the insulating substrate 20 such that the front bonding pad assembly 22, the electrical-conducting portions 24a, 24b, 24c, 24d, and the red, green, and blue LED chips (R), (G), (B) are sealingly encapsulated by the encapsulant 21.

In an example of this invention, the encapsulant 21 may have a light transmittance of 11±1.5% for a red light having a wavelength ranging from 615 to 630 nm, a light transmittance of 9÷1.5% for a green light having a wavelength ranging from 520 to 540 nm, and a light transmittance of 7±1.5% for a blue light having a wavelength ranging from 460 to 480 nm. In another example of this invention, the encapsulant 21 may have a light transmittance of 25±1.5% for a red light having a wavelength ranging from 615 to 630 nm, a light transmittance of 21±1.5% for a green light having a wavelength ranging from 520 to 540 nm, and a light transmittance of 17±1.5% for a blue light having a wavelength ranging from 460 to 480 nm. In yet another example of this invention, the encapsulant 21 may have a light transmittance of 35±1.5% for a red light having a wavelength ranging from 615 to 630 nm, a light transmittance of 30±1.5% for a green light having a wavelength ranging from 520 to 540 nm, and a light transmittance of 28±1.5% for a blue light having a wavelength ranging from 460 to 480 nm.

Figure 4:
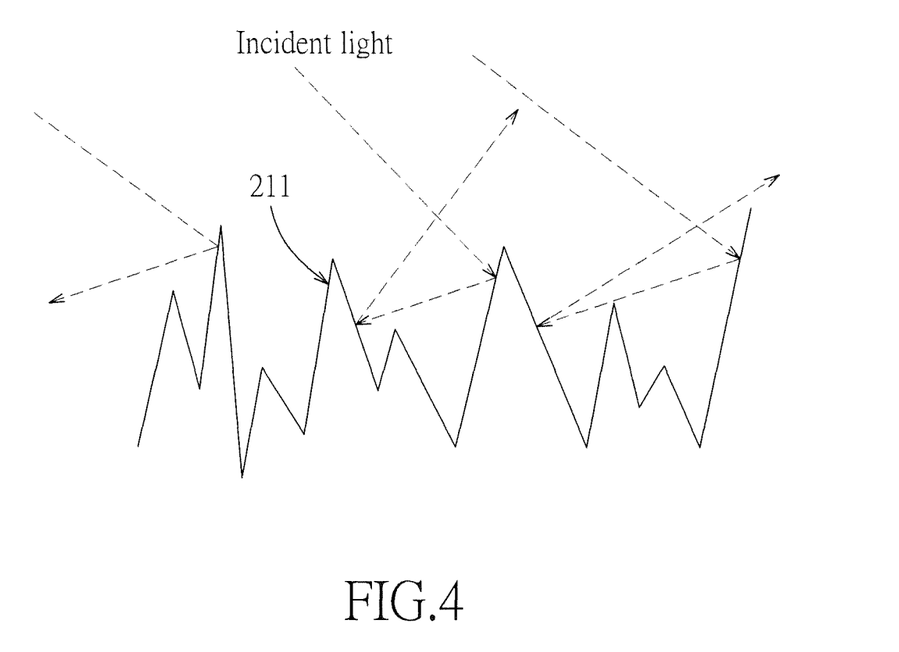
FIG. 4 is an enlarged fragmentary schematic view of an encapsulant included in the exemplary embodiment, which has a roughened surface.

Referring to FIG. 4, the encapsulant 21 has a roughened surface 211 that has a surface roughness (Ra) ranging from 1.5 to 1.7 μm. An incident light at the roughened surface 211 could be scattered in different directions and may not be directly reflected into human eyes. Therefore, it is more comfortable to human eyes. In this embodiment, the encapsulant 21 has a thickness ranging from 0.3 to 0.6 mm. In another one embodiment, the encapsulant 21 has a thickness of 0.37 mm.

Referring to FIG. 3, the LED package structure 2 further includes a solder resist 27, such as a green solder resist, that is filled in a front portion of each of the via holes 200 to prevent the encapsulant 21 from leaking to the rear soldering pad assembly 23 through the via holes 200. The solder resist 27 may be filled in the front two to three quarters of each of the via holes 200 to leave a recess 201 at a rear portion of a corresponding via hole 200.

During surface mounting process, a solder paste 30 is first placed on a top surface of a circuit board 3. The LED package structure 2 is then placed on the circuit board 3. The rear soldering pad assembly 23 of the LED package structure 2 presses the solder paste 30 such that a part of the solder paste 30 flows into the recess 201 of each of the via holes 200, thereby increasing the contact area between the LED package structure 2 and the circuit board 3. Therefore, the LED package structure 2 could be stably and fixedly mounted on the circuit board 3.

In this embodiment, the insulating substrate 20 may be a black substrate. The die-attach adhesive 26 may have a gray-scale ranging from 30 to 50, and may be a black adhesive. The LED package structure 2 further includes a black solder mask 28 that is disposed on the front surface of the insulating substrate 20 to partially cover the wire bonding pad unit, and to fully cover the solder resist 27 exposed from the front surface of the insulating substrate 20.

The encapsulant 21 has a light transmittance that ranges from 11 to 35% for a red light having a wavelength ranging from 615 to 630 nm, a light transmittance that ranges from 9 to 30% for a green light having a wavelength ranging from 520 to 540 nm, and a light transmittance that ranges from 7 to 28% for a blue light having a wavelength ranging from 460 to 480 nm.

Figure 5:
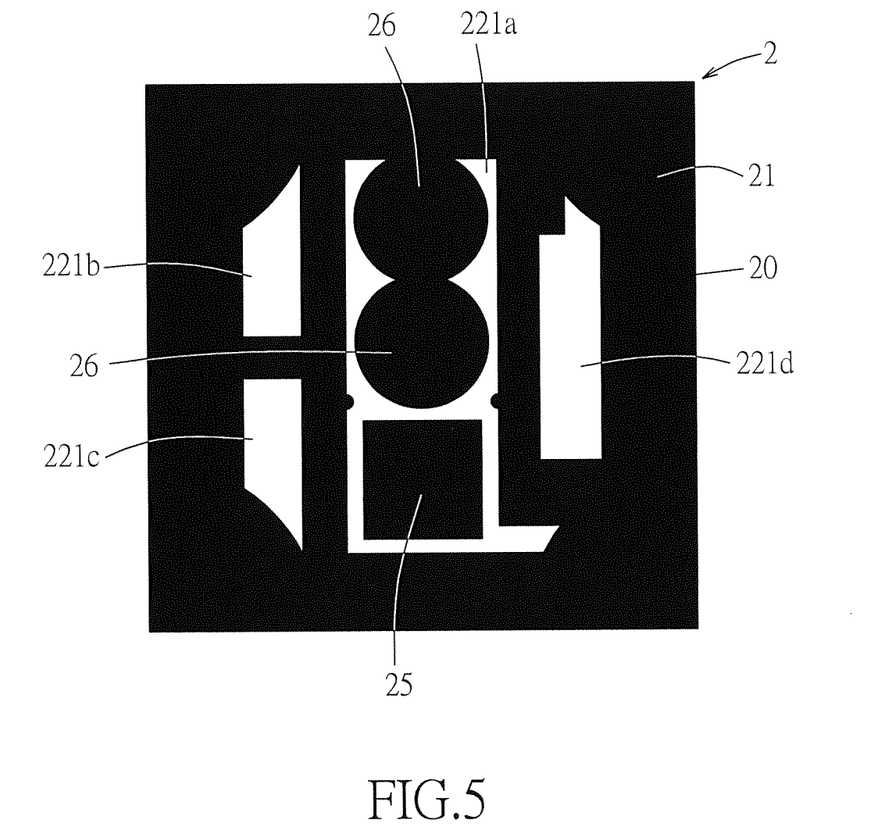
FIG. 5 illustrates a black insulating substrate included in the exemplary embodiment.

Referring to FIGS. 3 and 5, with the black insulating substrate 20, the dark-colored die-attach adhesive 26, a deep-colored red LED chip (R), and preferably the black solder mask 28, the majority of the LED package structure 2 in the absence of the encapsulant 21 is dark when viewed from the front, and only the first, second, and third wire bonding portions 221b, 221c, 221d are exposed for wire bonding. Moreover, since the encapsulant 21 has a dark color, a display device having a plurality of the LED package structures 2 is almost dark when the LED package structures 2 are not lit up. When the LED package structures 2 are lit up, contrast ratio of the display device is enhanced.

To sum up, with the black insulating substrate 20, the dark-colored die-attach adhesive 26, the dark-colored and light-transmissible encapsulant 21 and the black solder mask 28 that is found on the front surface of the insulating substrate 20 to cover the via holes 200, the connecting portion 222a of the die bonding pad 22a, and the first, second and third connecting portions 222b, 222c, 222d of the first, second and third wire bonding pads 22b, 22c, 22d of the wire bonding pad unit, the LED package structure 2 is black in color. A display device having a plurality of the LED package structures 2 is completely dark when the LED package structures 2 are not lit up. When the LED package structures 2 are in use, contrast ratio of the display device is enhanced. In addition, with the roughened surface 211 of the encapsulant 21, incident light could be scattered so that the display device is more comfortable to the viewer.

While the present invention has been described in connection with what are considered the most practical embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An LED package structure, comprising:
   an insulating substrate that has a front bonding pad assembly formed thereon;
   a dark-colored die-attach adhesive;
   a blue LED chip emitting a blue light and being mounted on said front bonding pad assembly via said dark-colored die-attach adhesive;
   a green LED chip emitting a green light and being mounted on said front bonding pad assembly via said dark-colored die-attach adhesive; and
   a dark-colored and light-transmissible encapsulant that is disposed on said insulating substrate and that encapsulates said blue LED chip and said green LED chip, said encapsulant having a light transmittance that ranges from 7% to 28% for said blue light and having a light transmittance that ranges from 9% to 30% for said green light.

2. The LED package structure as claimed in claim 1, further comprising a red LED chip emitting a red light and being mounted on said front bonding pad assembly via a conductive silver adhesive and that is encapsulated by said encapsulant, said encapsulant having a light transmittance that ranges from 11% to 35% for said red light.

3. The LED package structure as claimed in claim 2, wherein said encapsulant fully covers a front surface of said insulating substrate and sealingly encapsulates said front bonding pad assembly and said red, blue and green LED chips.

4. The LED package structure as claimed in claim 3, wherein said front bonding pad assembly includes:
   a die bonding pad including a carrying portion that has opposite first and second longitudinal sides and that is disposed on a center portion of said insulating substrate for mounting said red, blue and green LED chips; and
   a wire bonding pad unit including a first wire bonding pad for bonding a wire that is electrically connected to said blue LED chip, a second wire bonding pad for bonding a wire that is electrically connected to said green LED chip, and a third wire bonding pad for bonding a wire that is electrically connected to said red LED chip, said first and second wire bonding pads being disposed along and spaced apart from said first longitudinal side of said die bonding pad, said third wire bonding pad being disposed adjacent to and spaced apart from said second longitudinal side of said die bonding pad.

5. The LED package structure as claimed in claim 4, wherein said red, blue, and green LED chips are aligned in a longitudinal direction.

6. The LED package structure as claimed in claim 4, wherein said insulating substrate is formed with via holes at four corners thereof, said LED package structure further including a solder resist that is filled in a front portion of each of said via holes.

7. The LED package structure as claimed in claim 6, wherein said solder resist is filled in front two to three quarters of each of said via holes.

8. The LED package structure as claimed in claim 6, further comprising a black solder mask that is applied on said insulating substrate to partially cover said die bonding pad and said wire bonding pad unit, and to fully cover said solder resist exposed from a surface of said insulating substrate where said front bonding pad assembly is formed.

9. The LED package structure as claimed in claim 6, wherein said insulating substrate further has a rear soldering pad assembly disposed on a rear surface of said insulating substrate, said rear soldering pad assembly including four soldering pads that are respectively disposed on four corners of said rear surface of said insulating substrate.

10. The LED package structure as claimed in claim 9, wherein one of said soldering pads is used as a common anode, a cut being formed in said one of said soldering pads.

11. The LED package structure as claimed in claim 9, wherein said insulating substrate further has electrical-conducting portions disposed on said four corners thereof, each of said electrical-conducting portions being a metal conductive layer that is formed in a respective one of said via holes, said electrical-conducting portions having upper ends and lower ends, said upper ends being electrically connected to a connecting portion of said die bonding pad and first, second and third connecting portions of said first, second and third wire bonding pads, respectively, said lower ends being electrically connected to connecting portions of said soldering pads of said rear soldering pad assembly, respectively.

12. The LED package structure as claimed in claim 9, wherein said rear surface of said insulating substrate is coated with a cross-shaped white-colored solder mask such that a backside portion of said insulating substrate is exposed and such that each of said soldering pads is separated from said solder mask by said exposed backside portion of said insulating substrate.

13. The LED package structure as claimed in claim 12, wherein a triangular mark is formed on a center portion of said solder mask.

14. The LED package structure as claimed in claim 4, wherein said carrying portion of said die bonding pad includes a first region and a second region that are spaced apart from each other, said blue LED chip being mounted on said first region, said green and red LED chips being mounted on said second region.

15. The LED package structure as claimed in claim 4, wherein said first and second longitudinal sides of said carrying portion are respectively formed with opposite notches.

16. The LED package structure as claimed in claim 1, wherein said encapsulant has a surface roughness ranging from 1.5 to 1.7 μm.

17. The LED package structure as claimed in claim 1, wherein said insulating substrate is a black substrate.

18. The LED package structure as claimed in claim 1, wherein said front bonding pad assembly includes a die bonding pad including a carrying portion that has a first region and a second region spaced apart from said first region, said blue LED chip being disposed on said first region, said green LED chip being disposed on said second region.

19. The LED package structure as claimed in claim 1, wherein said dark-colored die-attach adhesive has a grayscale ranging from 30 to 50.

20. A LED package structure comprising:
an insulating substrate that has a front surface;
a blue LED chip disposed on said front surface of said insulating substrate, and emitting a blue light that has a wavelength ranging from 460 to 480 nm;
a green LED chip disposed on said front surface of said insulating substrate, and emitting a green light that has a wavelength ranging from 520 to 540 nm;
a red LED chip disposed on said front surface of said insulating substrate, and emitting a red light that has a wavelength ranging from 615 to 630 nm; and
a dark-colored and light-transmissible encapsulant disposed on said insulating substrate to encapsulate said blue, green and red LED chips, said encapsulant having a light transmittance that ranges from 7 to 28% for said blue light, a light transmittance that ranges from 9% to 30% for said green light, and a light transmittance that ranges from 11% to 35% for said red light.

* * * * *